(12) United States Patent
Hummel

(10) Patent No.: US 6,968,484 B2
(45) Date of Patent: Nov. 22, 2005

(54) METHOD FOR PARAMETRIZING AN INTEGRATED CIRCUIT AND AN INTEGRATED CIRCUIT THEREFOR

(75) Inventor: Ulrich Helmut Hummel, Teningen (DE)

(73) Assignee: Micronas GmbH, Freiburg (DE)

( * ) Notice: Subject to any disclaimer, the term of this patent is extended or adjusted under 35 U.S.C. 154(b) by 5 days.

(21) Appl. No.: 10/604,579

(22) Filed: Jul. 31, 2003

(65) Prior Publication Data
US 2004/0133829 A1 Jul. 8, 2004

Related U.S. Application Data

(63) Continuation of application No. 09/302,139, filed on Apr. 29, 1999, now abandoned.

(30) Foreign Application Priority Data
Apr. 30, 1998 (DE) ............................... 198 19 265

(51) Int. Cl.[7] .......................................... G11C 29/00
(52) U.S. Cl. .......................... 714/721; 365/5; 327/143
(58) Field of Search ........................ 714/721; 327/143, 327/198; 365/185.24, 233.5; 711/103

(56) References Cited

U.S. PATENT DOCUMENTS

| 4,940,909 A | 7/1990 | Mulder et al. |
| 4,965,768 A | 10/1990 | Takeuchi |
| 5,084,843 A | 1/1992 | Mitsuishi et al. |
| 5,150,188 A | 9/1992 | Hara et al. |
| 5,293,341 A | 3/1994 | Tsujimoto |
| 5,493,532 A * | 2/1996 | McClure ...................... 365/201 |
| 5,544,107 A | 8/1996 | Hill .............................. 365/201 |
| 5,627,784 A | 5/1997 | Roohparvar |
| 5,703,512 A * | 12/1997 | McClure ..................... 327/198 |
| 5,732,207 A | 3/1998 | Allen et al. ..................... 714/5 |
| 5,786,716 A * | 7/1998 | Honda et al. ............... 327/143 |
| 5,973,900 A | 10/1999 | Sher |

FOREIGN PATENT DOCUMENTS

DE 195 48 984 A 1 7/1998 ........... H01L 23/58

OTHER PUBLICATIONS

Schilling et al. (Electric Circuits: Discrete and Integrated, 1979; pp. 560-615).*
Doso, B., 09017957A, Patent Abstracts of Japan, Jan. 17, 1997.

* cited by examiner

*Primary Examiner*—Guy J. Lamarre
(74) *Attorney, Agent, or Firm*—Scott E. Kamholz; Foley Hoag LLP

(57) ABSTRACT

A method is described for parametrizing an integrated circuit by applying a digital start command signal followed by a parametrization data signal to the supply voltage terminal and/or the output terminal of the integrated circuit. During the parametrization process, the voltage level applied to the supply voltage terminal and/or the output terminal is kept above the normal operating voltage level and detected by a detector device provided in integrated circuit. The integrated circuit includes the supply voltage terminal, a reference potential terminal, and the output terminal, as well as an internal memory which is preferably non-volatile. The adjustment specification for parametrizing the integrated circuit is stored in the memory and activated by the parametrization data signal.

21 Claims, 3 Drawing Sheets

METHOD FOR PARAMETRIZING AN INTEGRATED CIRCUIT AND AN INTEGRATED CIRCUIT THEREFOR

CROSS REFERENCE TO RELATED APPLICATIONS

This application is a continuation of U.S. patent application Ser. No. 09/302,139, filed Apr. 29, 1999 now abandoned, the entire contents of which is hereby incorporated herein by this reference.

BACKGROUND OF INVENTION

A method for parametrizing integrated circuits is disclosed, for example, in DE 195 48 984 A1. The parametrization process adjusts and customizes an integrated circuit after the integrated circuit is manufactured or when the integrated circuit is mounted on circuit boards. The integrated circuit must be adjusted or customized in order to initialize and/or set specific values for certain circuit components of the integrated circuit, such as an identification value of the respective integrated circuit. For example, the integrated circuit may include an oscillator whose clock frequency must be set to a predetermined frequency. In addition, certain properties of a digital/analog or analog/digital converter incorporated in the integrated circuit may also be set by the parametrization process.

It is also known to use a so-called "Zener zapper" for parametrizing integrated circuits. The Zener zapper, however, requires that the integrated circuit has a relatively large number of terminals. Zener zapping is difficult to control and offers few programming choices. Moreover, the Zener zapper cannot be used to parametrize the integrated circuit during assembly. Alternatively, the integrated circuit may be parametrized by applying a certain bus protocol to separate terminals. The approach also requires a relatively large number of additional terminals and therefore increases the manufacturing cost of the integrated circuit. Incorporation of additional terminals may also cause reliability problems of the integrated circuit.

Finally, the integrated circuit can be parametrized by using special serial protocols. Such serial parametrization protocols, however, are very susceptive to errors. In addition, the bus protocols must be synchronized with the oscillator frequency of the integrated circuit. The special serial protocols also impose more stringent timing requirements.

It is therefore desirable to provide a method for parametrizing an integrated circuit without requiring additional terminals in addition to those already provided for normal operation. It is another object of the invention to provide an integrated circuit for carrying out the method.

SUMMARY OF INVENTION

In general, according to one aspect of the invention, the method for parametrizing an integrated circuit applies to the supply voltage terminal and/or output terminal of the integrated circuit a digital start command signal followed by a parametrization data signal. During the parametrization process, the start command signal may be detected by a detecting device incorporated in the integrated circuit. A voltage level that is higher than a normal operating voltage level of the integrated circuit, may be applied continuously during parametrization to the supply voltage terminal and output terminal. The higher voltage level may be provided to uniquely distinguish the parametrization process. The detecting device may be implemented in form of a comparator.

The method of the invention advantageously uses for parametrization the terminals which are already provided on the integrated circuit. Consequently, no additional terminals are required to perform parametrization. This not only significantly reduces the manufacturing cost of the integrated circuit, but also enhances the reliability of the integrated circuit in comparison to integrated circuits that require additional terminals for parametrization.

According to another embodiment of the method, the integrated circuit may be parametrized in spite of the presence of large fluctuations in the clock frequency of the bus protocol. A special error-protected bus protocol may also be provided for this purpose.

According to yet another embodiment, the parametrization signal may be formed by a code that provides an edge change after each bit. Preferably, a first logical state of a bit may be determined by an additional edge change approximately in the middle of the length of the bit and a second logical state of a bit may be determined by a signal that remains constant for the length of the bit.

For this purpose, the integrated circuit may include an oscillator and an interface device for processing a specified variable clock frequency of the parameter signal. A time window may be defined at the beginning of each bit within which window an edge change is expected to indicate the bit end.

Following the occurrence of least one edge change marking the bit end, the length of a bit may be determined and the next expected edge change may be expected to be offset by the time corresponding to the bit length. In another embodiment of the invention, the time duration of one bit may be determined from the average duration of at least two bit lengths.

An integrated circuit for carrying out the method may have at least one supply voltage terminal, a reference potential terminal, and an output terminal, as well as an oscillator and an interface device connected to the oscillator and a storage device. In addition, a detector device or a comparator may be connected between the supply voltage terminal and the interface device, wherein the interface device may also be connected to the output terminal of the storage device. The oscillator of the integrated circuit may serve as a time base for protocol decoding of the parametrization process as well as for generating a suitable cycle for the output signals to be applied to the output terminal of the integrated circuit.

The detector device or the comparator may detect the different operating voltage levels at the supply voltage terminal and may determine whether the integrated circuit operates in a "normal" state of or if the integrated circuit is being parametrized. The interface device may detect the data flow supplied during the parametrization process, issue commands, and generate a corresponding response. The storage device may be non-volatile and may permanently store received adjustment values.

The invention will now be described in greater detail with reference to an embodiment in conjunction with the drawings.

DETAILED DESCRIPTION

Figure 1:
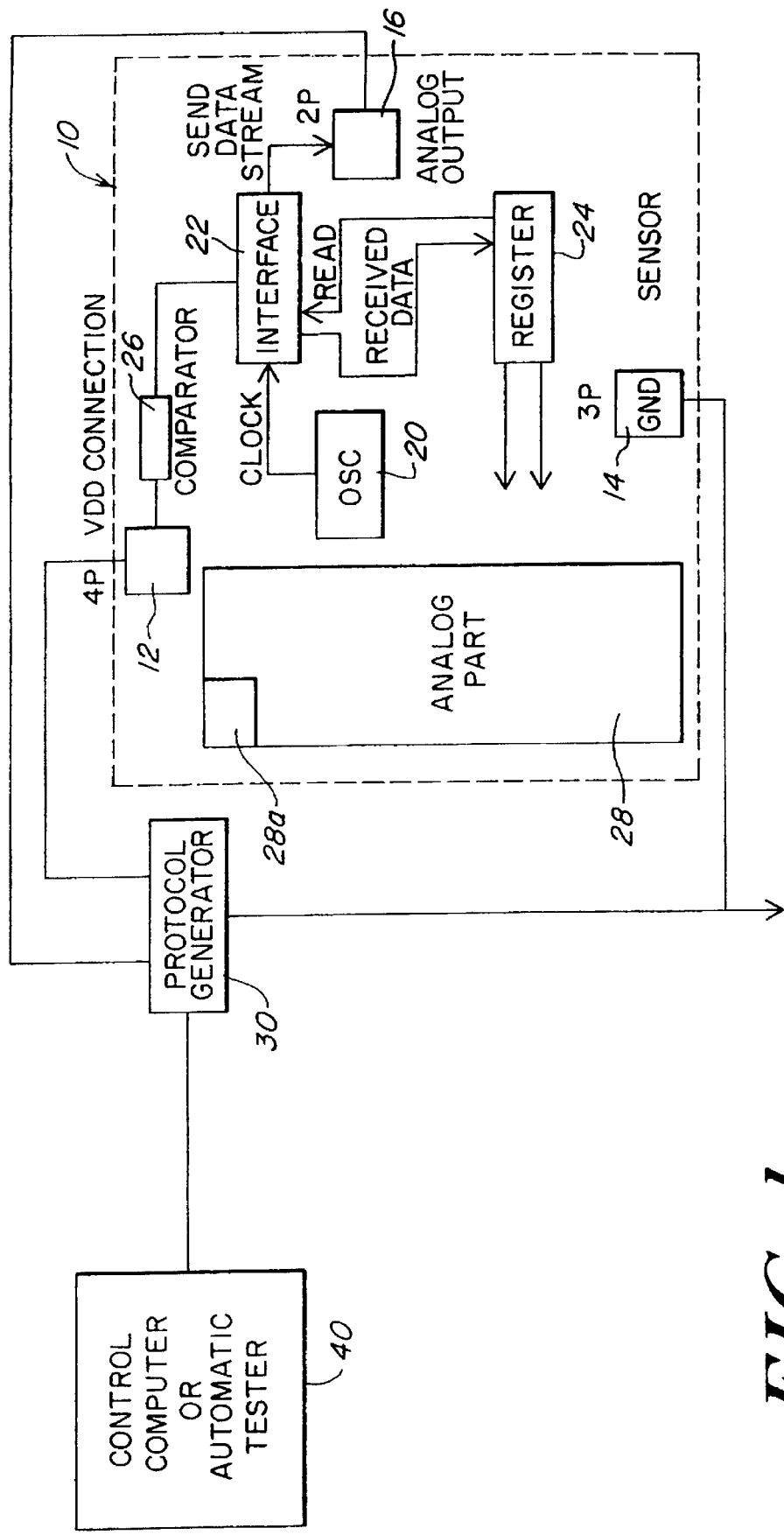
FIG. 1 is a functional block diagram of the circuit according to the invention with the protocol generator and control computer or automatic tester connected.

FIG. 1 shows a block diagram of an integrated circuit according to an embodiment of the invention. The integrated circuit in the exemplary embodiment includes an integrated circuit with an integrated sensor 28a which is located in an analog circuit component 28 of the integrated circuit The sensor 28a may be, for example, a Hall sensor.

The integrated circuit 10 of the illustrated embodiment has three connecting terminals, namely a supply voltage terminal 12, a reference potential terminal 14, and an output terminal 16 which serves as the output terminal for an analog signal. The integrated circuit also includes an internal oscillator 20 that provides a clock signal to an interface device 22. The interface device 22 is connected to a storage device 24, for example a register, and writes data to or reads data from the storage device 24. The interface device 22 is also connected to the supply voltage terminal 12 through a comparator 26 or a detector device. Finally, the interface device 22 is connected to the output terminal 16.

The detector device or the comparator 26 determines whether the integrated circuit 10 operates in a "normal" operating state, as determined, for example, by the application of a largely constant signal of approximately +5V, or whether a parametrization process is being initiated. The parametrization process is characterized by the fact that a voltage level that is clearly above the normal operating voltage of +5V is applied to the supply voltage terminal 12.

If the comparator 26 detects a parametrization process, the interface device 22 ensures that the data received by way of the parametrization data are directly written to the storage device 24 or that certain data stored in the storage device 24 are read from the received parametrization data. The data stored in the storage device 24 and released by the parametrization process, as indicated by the arrows in FIG. 1, activate or adjust the analog circuit component 28. In addition, the data can be used to customize the integrated circuit 10, in other words, to provide the integrated circuit 10 with a certain characteristic identification number to be used later to distinguish the integrated circuit from other similarly designed integrated circuits. Finally, the data released by the parametrization process may also permit variation and adjustment of the oscillator frequency of the oscillator 20.

In the block diagram of FIG. 1, a parametrization process is to be performed on the integrated circuit 10. Therefore, a control computer or automatic tester 40 is also shown which is connected to a protocol generator 30. The protocol generator 30 is connected to both the supply voltage terminal 12 and the output terminal 16 of the integrated circuit 10. The protocol generator 30 generates a data stream which is supplied to the supply voltage terminal 12 of integrated circuit 10. The protocol generator 30 also demodulates the reply signal which is present at the output terminal 16 of the integrated circuit 10. The reply signal is evaluated in the control computer or in the automatic tester 40. It is understood that the parametrization process is only performed if the protocol generator 30 continuously applies to the supply voltage terminal 12 a voltage level which significantly differs from, and more particularly, significantly exceeds the "normal" operating voltage level of the integrated circuit 10.

Figure 2:
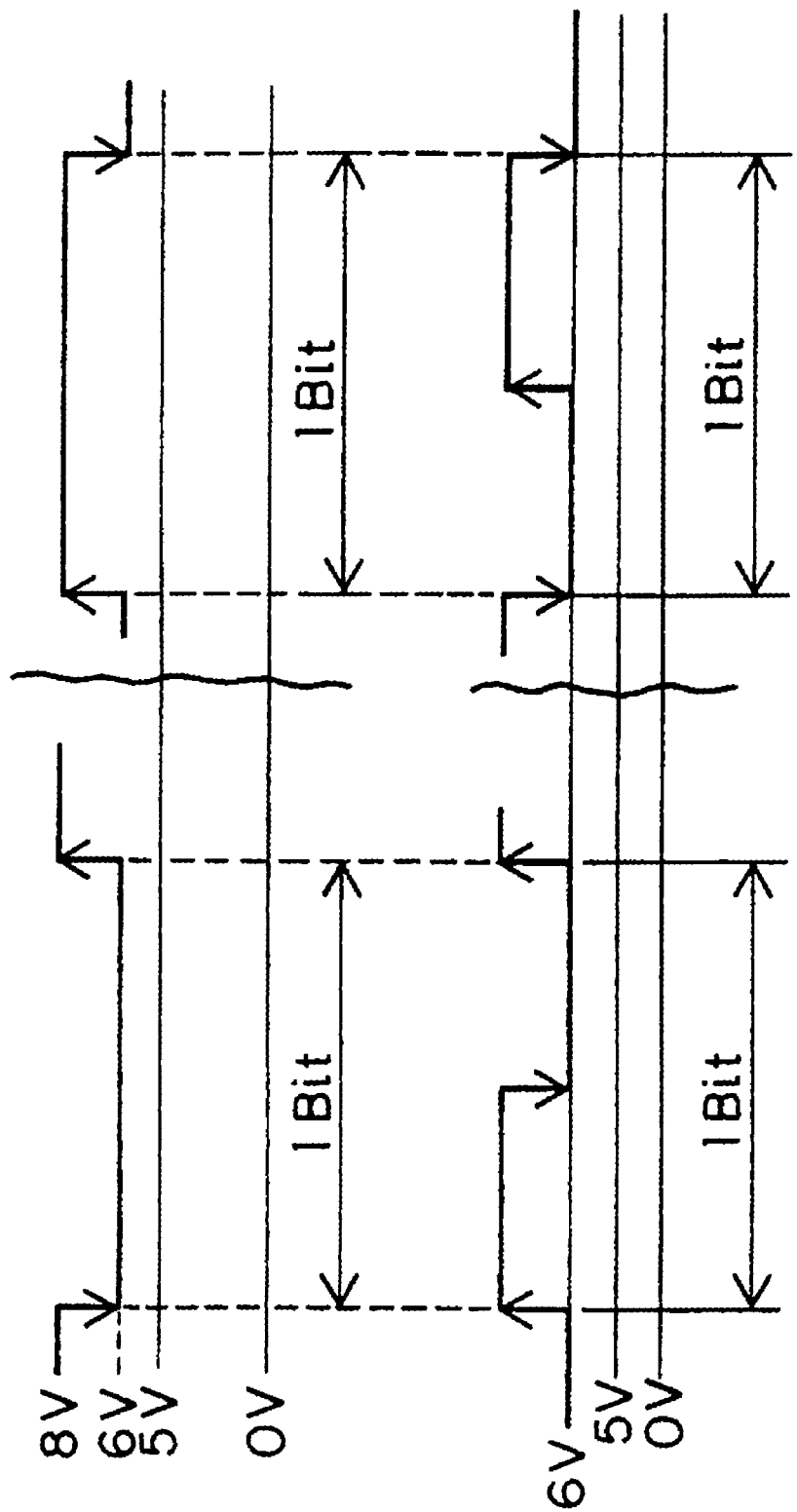
FIG. 2 shows exemplary logical states of a bit of a bus protocol for parametrizing the integrated circuit in FIG. 1.

FIG. 2 illustrates possible logical states of bits which are preferably used for parametrizing the integrated circuit 10. The logical states are preferably selected in such a way that an edge of the bit always changes at the beginning and at the end of the bit, independent of the logical state of the bit.

The upper diagram of FIG. 2 illustrates the possible states of a bit in a first logical state. As seen in the upper diagram, either a logical low-level or a logical high-level, both of which remain constant, is applied during the entire length of the bit. A first logical level, which may be the low-level of a bit, is characterized by a signal that remains constant during the entire length of the bit. This signal, as shown at the upper left in FIG. 2, can be characterized by a continuous +6V signal, wherein at the beginning and at the end of the signal the edge changes to +8V. Alternatively, the first logical state can also be characterized by a voltage signal that remains constant at +8V during the entire bit length, wherein at the beginning and at the end of the signal the edge changes to +6V. This feature guarantees that during the entire bit length, a bit is characterized by a voltage level which distinctly exceeds the "normal" voltage level of, for example, +5V.

The second logical state differs from the first logical state in that an additional edge change takes place within a bit length.

This is shown in the lower diagram of FIG. 2 for two possible bits that assume the second logical state. As seen in the lower diagram, an edge change always takes place at the beginning and end of each bit, regardless of the original voltage level of the bits.

This edge change, which always takes place at the beginning and end of each bit, is used to detect the presence of a parametrizing signal received by the integrated circuit, even if the clock frequency of the parametrizing signal is not known, because the clock frequency of the incoming parametrization signal can be unambiguously determined from the edge change itself. The parametrization process according to the invention is therefore relatively insensitive to variations in the clock frequency of the parametrization signal.

At the beginning of each bit, as detected by the presence of an edge, a time window is defined within which an edge change is expected to signal the end of a bit. This time window is preferably selected so as to lie between the maximum permissible frequency and the minimal permissible frequency of the parametrization signal. The maximum frequency of the parametrization signal is here slightly higher than half the minimum frequency of the parametrization signal.

The length of a bit is determined following the appearance of at least one edge change marking the bit end. The next anticipated edge change is then expected at a time which is offset by this bit length.

Advantageously, the length of a bit is determined from the average of at least two bit lengths.

Figure 3:
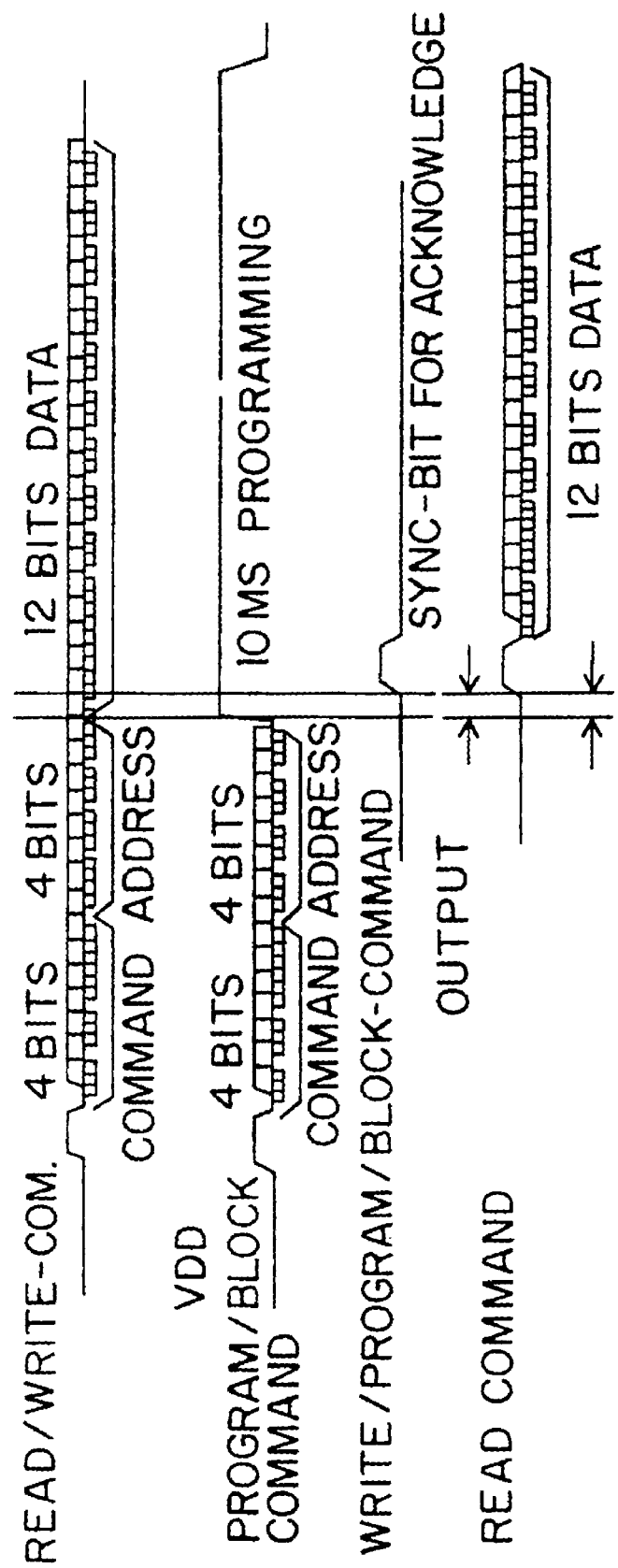
FIG. 3 shows exemplary bus protocols for a read/write command, a program/block command, a write/program/ block command, and a read command.

FIG. 3 shows possible bus protocols for parametrizing the integrated circuit. The read-write command is characterized, for example, by a sync bit followed by four command bits as well as four address bits followed by 12 data bits. The program/block command for example is characterized by an initial sync bit followed by four command bits, four address bits, and a predetermined programming time. The programming time may be, for example, 10 ms long. The write/program/block command is characterized by a single synchronization bit. The read command is characterized by a synchronization bit followed by 12 data bits.

Unlike conventional methods, such as the Zener zapping mentioned above, the parametrization process according to the invention advantageously does not require additional connection terminals on the integrated circuit. In addition, the integrated circuit may incorporate a simple on-chip oscillator with a relatively high error margin. Moreover, the programming times for the parametrization process of the invention are short; the parametrization protocol can be easily implemented; and parametrization can be performed at a comparatively low speed.

What is claimed is:

1. A method for parametrizing an integrated circuit with a supply voltage terminal and an output terminal, comprising:
applying to the supply voltage terminal a digital start command signal followed by a parametrization data signal; and
detecting the start command signal with a detecting device located in the integrated circuit, wherein a voltage level that is higher than a normal operating voltage level of the integrated circuit, is applied continuously during parametrization to the supply voltage terminal.

2. The method of claim 1, wherein the parametrization data signal includes a code having a plurality of bits and wherein after each bit an edge thereof is changed.

3. The method of claim 2, wherein a first logical state of a bit is determined by an additional edge change approximately in the middle of a bit length and a second logical state of a bit is determined by a signal that remains constant during the bit length.

4. The method of claim 2, wherein the integrated circuit further includes an oscillator and an interface device for processing a predetermined variable clock frequency of the parametrization signal, and wherein a time window is defined at the beginning of each bit and wherein within the duration of the time window an edge change is expected signaling an end of the bit.

5. The method of claim 4, wherein a time duration of the bit is determined following the occurrence of at least one edge change marking the end of the bit, and wherein the next edge change is expected to be offset by this time duration.

6. The method of claim 5, wherein the time duration of a bit is determined from the average time duration of at least two consecutive bits.

7. The method of claim 1, wherein the integrated circuit further includes a non-volatile memory for storing an adjustment specification for adjusting at least one circuit component to be parametrized and wherein the parametrization data activate the adjustment of the circuit component according to the adjustment specification.

8. The method of claim 1, wherein the output terminal of the integrated circuit supplies a signal confirming the parametrization process.

9. The method of claim 1, wherein the parametrization process includes a parameter address identifying the integrated circuit.

10. An integrated circuit receiving parametrization data signals for parametrizing the integrated circuit, comprising:
a supply voltage terminal and an output terminal, the supply voltage terminal receiving a digital start command signal followed by a parametrization data signal;
an oscillator;
a storage device;
an interface device connected to the oscillator, the output terminal and the storage device; and
a detecting device connected between the supply voltage terminal and the interface device for detecting the start command signal, wherein a voltage level that is applied continuously during parametrization to the supply voltage terminal is higher than a normal operating voltage level of the integrated circuit.

11. The integrated circuit of claim 10, further comprising:
an analog circuit section connected to the storage device, wherein the analog circuit section is adjusted in accordance with the parametrization data signal.

12. The integrated circuit of claim 10, wherein the detecting device has a threshold voltage of approximately +5V.

13. The integrated circuit of claim 10, wherein the storage device is a non-volatile storage device.

14. The integrated circuit of claim 10, wherein the integrated circuit comprises at least one sensor.

15. The integrated circuit of claim 14, wherein the sensor is a Hall sensor.

16. The integrated circuit of claim 10, wherein the parametrization data signal is defined by a sync bit followed by command bits, address bits, and data bits.

17. The integrated circuit of claim 16, wherein the sync bit is followed by four command bits, four address bits, and twelve data bits.

18. A method for parametrizing an integrated circuit, comprising:
applying to a supply voltage terminal of the integrated circuit a parametrization signal,
the parametrization signal comprising a continuous voltage level that is higher than a normal operating voltage level of the integrated circuit to the supply voltage terminal of the integrated circuit.

19. An integrated circuit, comprising:
a plurality of terminals receiving operating voltage levels to operate the integrated circuit, the plurality of terminals including a supply voltage terminal; and
means for parametrizing the integrated circuit by continuously applying to the supply voltage terminal a voltage level that is higher than the normal operating voltage levels of the integrated circuit, during the presence of a parametrization signal.

20. The integrated circuit of claim 19, wherein a number of terminals for parametrizing the integrated circuit is no greater than a number of terminals required to operate the integrated circuit.

21. A system for parametrizing an integrated circuit, comprising:
a control device that defines functions of the integrated circuit to be parametrized; and
a protocol generator, coupled to the control device, that receives the defined functions from the control device and converts the functions into parametrization signals, wherein the protocol generator is connected to a supply voltage terminal, and wherein the integrated circuit is parametrized by continuously applying to the supply voltage terminal a voltage level that is higher than the normal operating voltage levels of the integrated circuit, during the presence of the parametrization signal.

* * * * *